United States Patent

[11] 3,586,925

[72] Inventor Jacques R. Collard
Trenton, N.J.
[21] Appl. No. 759,074
[22] Filed Sept. 11, 1968
[45] Patented June 22, 1971
[73] Assignee RCA Corporation

[54] GALLIUM ARSENIDE DIODES AND ARRAY OF DIODES
8 Claims, 7 Drawing Figs.

[52] U.S. Cl. .......... 317/234, 148/33, 148/176
[51] Int. Cl. .......... H01l 7/36, H01l 9/00
[50] Field of Search .......... 317/235, 48.5, 47.1, 234, 9, 235, 234

[56] References Cited
UNITED STATES PATENTS

| | | | |
|---|---|---|---|
| 3,421,055 | 1/1969 | Bean et al. | 317/234 |
| 3,375,418 | 3/1968 | Garnache et al. | 317/235 |
| 3,447,235 | 6/1969 | Rosvold et al. | 29/578 |
| 3,425,879 | 2/1969 | Shaw et al. | 148/175 |

*Primary Examiner*—John W. Huckert
*Assistant Examiner*—Martin H. Edlow
*Attorney*—Glenn H. Bruestle

ABSTRACT: A diode or an array of diodes comprising a substrate of single crystal GaAs of one conductivity type and an epitaxial layer of GaAs of opposite type grown on the substrate through an aperture in a layer of passivating material where the aperture is octagonal in shape and having its sides oriented in the {100} and {110} crystallographic planes of the substrate material.

INVENTOR
JACQUES R. COLLARD

BY W. S. Hill
AGENT

INVENTOR
JACQUES R. COLLARD

BY W. S. Hill
AGENT

GALLIUM ARSENIDE DIODES AND ARRAY OF DIODES

The invention herein described was made in the course of or under a contract or subcontract thereunder with the Department of the Army.

BACKGROUND OF THE INVENTION

Arrays of varactor diodes on a common semiconductor substrate are desirable in a number of practical applications such as frequency multipliers, parametric amplifiers and avalanche oscillators. The diodes are used to generate or amplify microwave oscillations. For these applications it is desirable that the diodes have a very high cutoff frequency, a very high breakdown voltage and that they not degrade at high temperatures.

To satisfy the above requirements it has been proposed to use PN junction diodes made of a high bandgap material, such as gallium arsenide, and to fabricate each diode as an individual mesa on the substrate layer. Previously, the diodes have been fabricated by growing a P+ epitaxial layer or by forming the P+ layer by diffusion, on an N-type substrate, and then forming the mesas by a masking and etching process.

If the diodes are formed by the process which includes growing an epitaxial P+ layer on top of an N-type layer which is, in turn, on an N+ substrate, the mesas usually project to a height of about 15—20 microns above the N+ substrate because the mesa includes both the P+ and the N layers. In order to make electrical contact to the top of each diode, it is necessary to deposit a layer of metal thereon. This entails the use of a masking material to protect the sides of the mesas during metal deposition on the tops. When photoresists were tried for this purpose it was found that it was very difficult to apply the resist evenly to the relatively high mesas walls. Some of the wall surface often remained uncoated.

To overcome the problem of nonuniform resist coating on the mesas, $Si_3N_4$ was deposited on the mesas to passivate the walls. However, because of the high deposition temperature of $Si_3N_4$ (700° C.) the P+ contact areas on the mesa tops had to be metallized after deposition of the nitride. This process also required that photoresist solutions be used on the walls and also on the tops of the mesas, and examination after etching showed that conventional photoresists do not adhere well to mesa walls even where the resist is used at maximum viscosity.

When the P+ layers of the diodes are formed by diffusion of a metal such as zinc into an N layer of semiconductor, other problems arise. If silicon dioxide is used as the masking material, the high concentrations of zinc often result in some of the zinc diffusing through the protective oxide coating to ruin the diode.

OBJECTS OF THE INVENTION

One object of the present invention is to provide an improved epitaxial gallium arsenide diode structure.

Another object of the invention is to provide an improved GaAs varactor diode suitable for use in an array of diodes on a common substrate.

A further object of the invention is to provide an improved method of making epitaxial PN junction diodes for microwave applications.

SUMMARY OF THE INVENTION

The foregoing problems, which are encountered in making diodes either by diffusion process or by growing epitaxial layers on a substrate and forming diodes by a masking and etching process, are avoided by the improved diode and process of making the diode, of the present invention. The improved diode comprises an epitaxial layer of one conductivity type grown through an aperture in a passivating layer on a substrate of opposite conductivity type. The aperture is octagonal in shape and, for a GaAs diode, aligned so that the sides of the octagon are oriented in {100} and 110} planes of the GaAs substrate crystallographic structure.

If the aperture in the passivating layer is made in some other shape, such as circular, the epitaxial layer grown within the aperture does not completely fill the opening. Then, when metal is applied over the top and projecting sidewalls of the diode, some of the metal tends to get deposited below the top surface of the passivating layer and may short circuit the diode junction.

THE DRAWING

PREFERRED EMBODIMENT

Figure 1:
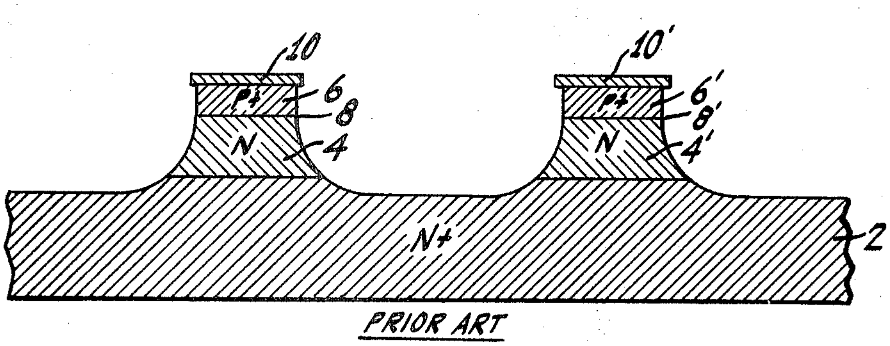
FIG. 1 is a cross section view of a part of a mesa PN junction diode array of the prior art.

Referring first to FIG. 1, which is a cross section view of part of an array of PN junction diodes in accordance with one of the prior art techniques, there is shown an N+ semiconductor substrate 2 having portions of an N layer 4 and 4' grown epitaxially on the substrate 2 and portions of a P+ layer 6 and 6' grown epitaxially on the layer 4 and 4'. PN junctions 8 and 8' are between the epitaxial layers 4 and 6 and 4' and 6', respectively. These layer portions comprise PN junction diodes which may be made by first putting down an epitaxial N-type layer over the entire surface of the N+ layer 2 and, depositing a P+ epitaxial layer over the entire top surface of the N layer. The mesas are produced by a masking and etching process. The diodes are completed by depositing metal layers 10 and 10' on top of theP' layers 6 and 6', respectively. It will be noted that the diode mesas are relatively high since both the P+ and N layers project above the original substrate 2. As stated previously, the relatively high mesas have introduced a masking problem such that it has been very difficult to apply the metal layers on top of the mesas without having some of the metal extend down across the exposed PN junctions, thus short circuiting the diodes.

Figure 2:
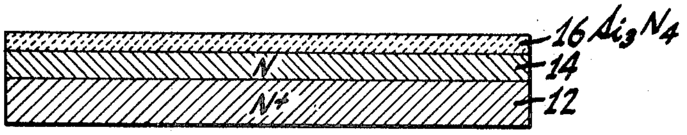
PRIOR ART FIG. 2.
FIG. 2 is a cross section view of a semiconductor wafer illustrating an early stage of manufacture of a diode of the present invention.

In accordance with the present invention (as illustrated in FIG. 2), PN junction diodes are formed by starting with an N+ substrate wafer 12 of GaAs and epitaxially depositing an N layer of GaAs 14 on the substrate layer 12. The layer may be made N-type by gaseous phase growth or liquid phase growth. The layer 14 is grown so that its surface is oriented in an {100} crystallographic plane.

After formation of the N-type layer, passivating layer 16 of silicon nitride is deposited thereon. The silicon nitride may have a thickness of about 800° A. The silicon nitride layer may be deposited, for example, by the pyrolysis of silane and ammonia in an excess of hydrogen at a temperature of 875° C. Silicon nitride is used as part of the passivating layer because it is more resistant to etching than silicon dioxide and also because it is more resistant than silicon dioxide to the diffusion of zinc when this metal is used to dope a gallium arsenide layer.

Figure 3:
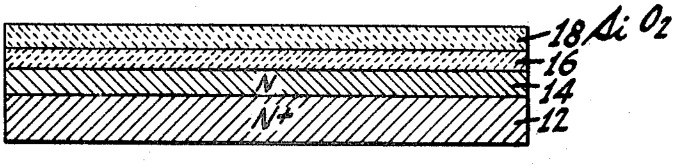
FIG. 3 is a view similar to that of FIG. 2 showing a later stage of manufacture of the diode.
Figure 4:
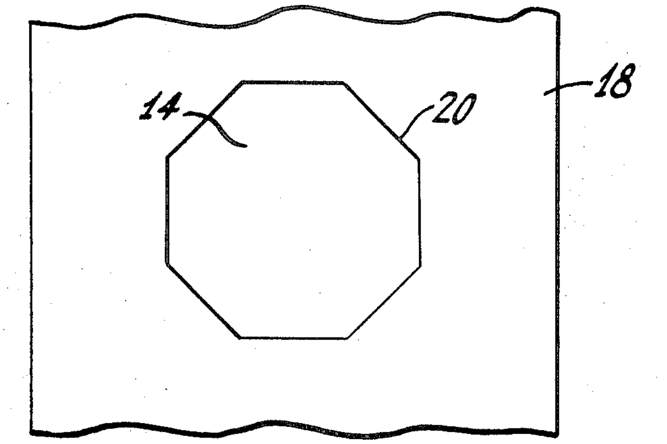
FIG. 4 is a plan view of the assembly of FIG. 3 illustrating a further stage of manufacture of the diode.
Figure 5:
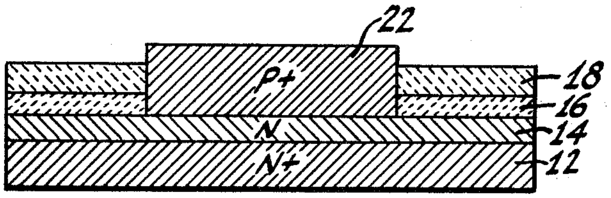
FIG. 5 is a cross section view of the assembly of FIG. 4 illustrating a still later stage of the diode manufacturing process with an epitaxial layer deposited.

As illustrated in FIG. 3, a layer of silicon dioxide 18 is deposited on top of the silicon nitride layer 16 by any process well known in the art. The silicon dioxide layer may have a thickness of about 4000° A.

The silicon dioxide layer is next coated with a layer of conventional photoresist (not shown) such as KPR and a master pattern (also not shown) is placed on top of the photoresist.

The master pattern has an octagonal-shaped dark area where a similar shaped aperture is to be etched through the photoresist and the passivating layers 16 and 18. If an array of diodes is being made, the master pattern has a corresponding array of octagonal-shaped dark areas. The master pattern is oriented, using X-ray techniques, with respect to the N layer 14 such that the sides of the octagons are aligned parallel to the{100} and{110}planes of the layers 14. After exposure through the master pattern and developing of the photoresist to remove the photoresist beneath the shaded areas of the pattern, the passivating layers 18 and 16 are etched through to the top surface of the N layer 14. The silicon dioxide layer 18 may be etched with a buffered hydrofluoric acid solution, and the silicon nitride layer may then be etched through with boiling phosphoric acid. This provides one (or more) octagonal-shaped apertures 20 passing through the passivating layers 16 and 18 to the N layer 14.

After the formation of the octagonal-shaped aperture 20, a P+ epitaxial layer of GaAs 22 is grown on of the layer 14 of N-type GaAs The layer 22 is grown thick enough to project slightly above the top surface of the silicon dioxide layer 18. The thickness may be about 1—3 microns, for example, with 1—2 microns being preferred. A PN junction is formed between the P+ and N-type layers.

The GaAs layer 22 may be grown by passing vapors of gallium trichloride, arsenic and zinc, in the presence of hydrogen gas, over the heated surface of the N-type layer 14. Prior to depositing the GaAs it is preferable to clean the substrate surface by some method which does not cause undercutting of the passivating layers. Treatment with trichloroethylene or boiling alcohol has been found suitable.

When the GaAs is grown under these conditions, the epitaxially grown material completely fills the aperture. If a circular-shaped aperture is used, the lower layers of deposited material often do not conform to the circular shape because of the crystal structure. Then, later, when metal is deposited on the top and sides of the GaAs mesa that is formed, some of the metal may find its way down to the base of the mesa between the GaAs and the passivating layers and thus short out the PN junction of the diode.

Figure 6:
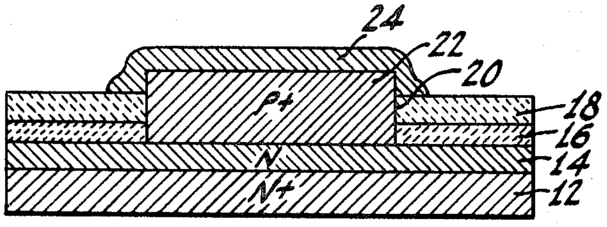
FIG. 6 is a view similar to that of FIG. 5 with a metal contact layer applied to the epitaxial layer.

The next step in the manufacture of the diode is to deposit a meal layer 24 over the top of the mesa 22 and also over the edges of the mesa and around the adjacent surface of the silicon dioxide layer 18 (FIG. 6). When the metal is not confined to just the mesa top, as in some prior art devices, a larger area is provided for making a lead connection and this is an advantage in device manufacture.

The metal layer 24 may be deposited by vacuum evaporating pure silver over the entire upper surface of the device and then, by a conventional photomasking process, removing unwanted silver using Farmer's reducing solution. The substrate may be maintained at a temperature of about 100° C. or above, as the silver is being deposited.

After deposition of the silver is complete and excess silver has been removed, the device is sintered at 400° in a hydrogen atmosphere for 5 minutes. It is then quenched and reheated at 450° C. in hydrogen for 3 minutes.

Figure 7:
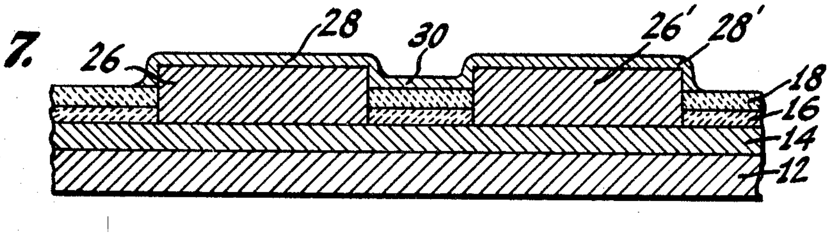
FIG. 7 is a section view of part of a diode array in accordance with the invention.

Although the invention may be used to make a single diode, as illustrated, it is particularly useful in making an array of diodes on a single substrate. As shown in FIG. 7, the array may comprise a plurality of epitaxially grown P+ mesas 26 and 26' with metal layers 28 and 28' on the tops and projecting sides. Diodes may be connected in parallel or some other desired pattern by leaving stripes of metal 30 on top of the silicon dioxide layer 18 between certain diodes. These metal stripes 30 may be defined by masking and etching at the same time as the metal layers 28 and 28' are formed.

What I claim is:

1. A semiconductor junction diode comprising a. a substrate of single crystal semiconductive gallium arsenide of one conductivity type having a surface oriented in the {100} crystallographic plane, b. a thin passivating layer of an insulating substance, having a predetermined thickness, on said surface, c. an aperture in said passivating layer extending to said surface, said aperture being octagonal in shape and having sides oriented in the {100} and {110} planes of said substrate, and d. an epitaxial layer of gallium arsenide of opposite conductivity type on said substrate surface within said aperture having a thickness greater than that of said passivating layer, such that portions of the sidewalls of said gallium arsenide layer project above said passivating layer, e. a PN junction being present between said substrate and said epitaxial layer.

2. A diode according to claim 1 in which a layer of metal is disposed on the top of said projecting sidewalls of said epitaxial layer above said passivating layer.

3. A diode according to claim 1 in which said passivating layer comprises a lower portion of silicon nitride and an upper portion of silicon dioxide.

4. A diode according to claim 2 in which said passivating layer comprises a lower portion of silicon nitride and an upper portion of silicon dioxide.

5. A semiconductor device of the type comprising an array of mesa-type semiconducting diodes on a common substrate, said device comprising:

a. a substrate layer of single crystal GaAs of one conductivity type having a surface oriented in the {100} crystallographic plane, b. a thin passivating layer of an insulating substance, having a predetermined thickness, on said surface, c. an array of apertures in said passivating layer extending to said surface, said apertures being octagonal in shape and having sides oriented in the {100} and {110} planes of said substrate, and d. an epitaxial layer of GaAs of opposite conductivity type on said substrate surface within each of said apertures having a thickness greater than that of said passivating layer, such that portions of the sidewalls of each of said epitaxial layers project above said passivating layer, e. PN junctions being present between said substrate and each of said epitaxial layers.

6. A device according to claim 5 in which each of said diodes has a layer of metal on its top surface and extending over said projecting sidewalls.

7. A device according to claim 5 in which at least some of said diodes are connected by metallic means disposed on said passivating layer.

8. A device according to claim 6 in which said metal is silver.